US011394397B2

(12) United States Patent
Teixeira De Abreu Pinho et al.

(10) Patent No.: US 11,394,397 B2
(45) Date of Patent: Jul. 19, 2022

(54) SYSTEM AND METHOD FOR SELECTING A LOSSLESS COMPRESSION ALGORITHM FOR A DATA OBJECT BASED ON PERFORMANCE OBJECTIVES AND PERFORMANCE METRICS OF A SET OF COMPRESSION ALGORITHMS

(71) Applicant: EMC IP Holding Company LLC, Hopkinton, MA (US)

(72) Inventors: Rômulo Teixeira De Abreu Pinho, Niterói (BR); Vinicius Michel Gottin, Rio de Janeiro (BR); Joel Evans Christner, San Jose, TX (US)

(73) Assignee: EMC IP Holding Company LLC, Hopkinton, MA (US)

( * ) Notice: Subject to any disclaimer, the term of this patent is extended or adjusted under 35 U.S.C. 154(b) by 85 days.

(21) Appl. No.: 17/081,614

(22) Filed: Oct. 27, 2020

(65) Prior Publication Data

US 2022/0131556 A1    Apr. 28, 2022

(51) Int. Cl.
*H03M 7/30* (2006.01)
*G06K 9/62* (2022.01)
*H03M 7/32* (2006.01)

(52) U.S. Cl.
CPC ........ *H03M 7/6082* (2013.01); *G06K 9/6256* (2013.01); *H03M 7/3037* (2013.01); *H03M 7/3073* (2013.01)

(58) Field of Classification Search
CPC ............. H03M 7/6082; H03M 7/3037; H03M 7/3073; G06K 9/6256
USPC ..................................... 341/55–80
See application file for complete search history.

(56) References Cited

U.S. PATENT DOCUMENTS

| 9,450,603 | B2* | 9/2016 | Dickie | H03M 7/6005 |
| 9,503,123 | B1* | 11/2016 | Pinho | G06N 5/04 |
| 9,558,566 | B2* | 1/2017 | Charikar | H04N 19/146 |
| 9,660,666 | B1 | 5/2017 | Ciarlini et al. | |
| 9,898,375 | B1* | 2/2018 | Fricker | G06F 11/1469 |
| 9,935,652 | B1* | 4/2018 | Chalmer | H03M 7/46 |

(Continued)

OTHER PUBLICATIONS

Palov, "7-zip is a file archiver with a high compression ratio," 2016, 2 pages.

(Continued)

*Primary Examiner* — Lam T Mai
(74) *Attorney, Agent, or Firm* — Chameberlain, Hrdlicka, White, Williams & Aughtry (57) ABSTRACT

A method for managing data includes obtaining a compression algorithm selection request for a data object, wherein the data object is generated by a production host, identifying, in response to the compression algorithm selection request, a set of production host performance objectives of the production host, performing a compression algorithm selection analysis using the set of production host performance objectives and a compression selection model to obtain a compression algorithm selection for a compression algorithm, specifying the compression algorithm to the production host using a data agent, wherein the data agent is operatively connected to the production host, initiating a compression on the data object using the data agent by applying the compression algorithm to obtain a compressed data object, and initiating a storage of the compressed data object.

20 Claims, 8 Drawing Sheets

(56) References Cited

U.S. PATENT DOCUMENTS

| | | | |
|---|---|---|---|
| 9,954,550 B1* | 4/2018 | Ciarlini | H03M 7/30 |
| 9,973,210 B1* | 5/2018 | Mahony | H03M 7/3086 |
| 10,103,745 B1* | 10/2018 | Rodrigues de Campos | H03M 7/24 |
| 10,122,379 B1* | 11/2018 | Ciarlini | H03M 7/30 |
| 10,133,551 B1* | 11/2018 | Ciarlini | H03M 7/24 |
| 10,153,779 B1* | 12/2018 | Bordignon | H03M 7/24 |
| 10,169,359 B1* | 1/2019 | Pinho | G06F 16/182 |
| 10,200,060 B1* | 2/2019 | Ciarlini | G06F 7/483 |
| 10,235,134 B1* | 3/2019 | Dangi | G06F 5/01 |
| 10,585,856 B1* | 3/2020 | Bigman | G06F 3/0604 |
| 10,666,289 B1* | 5/2020 | Sofia | H03M 7/40 |
| 10,762,667 B2* | 9/2020 | Mekuria | G06T 9/001 |
| 11,068,405 B2* | 7/2021 | Armangau | G06F 3/0673 |
| 2005/0265585 A1* | 12/2005 | Rowe | G06V 40/1324 382/191 |
| 2005/0265586 A1* | 12/2005 | Rowe | G06V 40/1394 382/124 |
| 2005/0271258 A1* | 12/2005 | Rowe | G06V 40/1394 382/191 |
| 2011/0163163 A1* | 7/2011 | Rowe | G06V 40/45 235/462.25 |
| 2015/0205992 A1* | 7/2015 | Rowe | G06V 40/1324 382/124 |
| 2020/0341670 A1* | 10/2020 | Zhang | G06F 3/0631 |
| 2020/0348957 A1* | 11/2020 | Krasner | G06F 9/544 |
| 2020/0348959 A1* | 11/2020 | Krasner | G06F 9/544 |
| 2021/0027115 A1* | 1/2021 | Davis | G06F 3/0673 |

OTHER PUBLICATIONS

J.-l. Gailly and M. Adler, "Gzip," 2003, 1 page.

Z. Tarantov, "Snappy," 2011, 2 pages.

Y. Collet, "Lz4," 2017, 12 pages.

M. Mahoney, "Paq8," 2007, 9 pages.

P. Lindstrom and M. Isenburg, "Fast and efficient compression of floating-point data." IEEE transactions on visualization and computer graphics, vol. 12, No. 5, pp. 1245-1250, 2006, 7 pages.

M. Isenburg and P. Alliez, "Compressing polygon mesh geometry with parallelogram prediction," in IEEE Visualization, 2002. VIS 2002., Nov. 2002, pp. 141-146., 6 pages.

Kooten, P. van. (2019). shrynk—Using Machine Learning to learn how to Compress. Retrieved Dec. 11, 2019, 14 pages.

Murashko, O. (2018). Using Machine Learning To Select and Optimise Multiple Objectives in Media Compression. PhD Thesis. University of St Andrews, 165 pages.

Sneyers, J., & Wuille, P. (2016). FLIF: Free lossless image format based on MANIAC compression. In 2016 IEEE International Conference on Image Processing (ICIP) (pp. 66-70). IEEE., 5 pages.

Lin, T. Y., Maire, M., Belongie, S., Hays, J., Perona, P., Ramanan, D., Dollár, P., & Zitnick, C. L. (2014). Microsoft COCO: Common objects in context. Lecture Notes in Computer Science (Including Subseries Lecture Notes in Artificial Intelligence and Lecture Notes in Bioinformatics), 8693 LNCS(PART 5), 740-755. 16. pages.

Harwath, D., & Glass, J. (2015). Deep Multimodal Semantic Embeddings for Speech and Images. 237-244, 8 pages.

* cited by examiner

SYSTEM AND METHOD FOR SELECTING A LOSSLESS COMPRESSION ALGORITHM FOR A DATA OBJECT BASED ON PERFORMANCE OBJECTIVES AND PERFORMANCE METRICS OF A SET OF COMPRESSION ALGORITHMS

BACKGROUND

Computing devices in a system may include any number of computing resources such as processors, memory, and persistent storage. The storage of large amounts of data may require large amounts of computing resources. The larger the data, the more computing resources required to perform the storage of such data.

SUMMARY

In general, in one aspect, the invention relates to a method for managing data. The method includes obtaining a compression algorithm selection request for a data object, wherein the data object is generated by a production host, identifying, in response to the compression algorithm selection request, a set of production host performance objectives of the production host, performing a compression algorithm selection analysis using the set of production host performance objectives and a compression selection model to obtain a compression algorithm selection for a compression algorithm, specifying the compression algorithm to the production host using a data agent, wherein the data agent is operatively connected to the production host, initiating a compression on the data object using the data agent by applying the compression algorithm to obtain a compressed data object, and initiating a storage of the compressed data object.

In one aspect, the invention relates to non-transitory computer readable medium that includes computer readable program code, which when executed by a computer processor enables the computer processor to perform a method for managing data. The method includes obtaining a compression algorithm selection request for a data object, wherein the data object is generated by a production host, identifying, in response to the compression algorithm selection request, a set of production host performance objectives of the production host, performing a compression algorithm selection analysis using the set of production host performance objectives and a compression selection model to obtain a compression algorithm selection for a compression algorithm, specifying the compression algorithm to the production host using a data agent, wherein the data agent is operatively connected to the production host, initiating a compression on the data object using the data agent by applying the compression algorithm to obtain a compressed data object, and initiating a storage of the compressed data object.

In one aspect, the invention relates to a system that includes a processor and memory that includes instructions, which when executed by the processor, perform a method. The method includes obtaining a compression algorithm selection request for a data object, wherein the data object is generated by a production host, identifying, in response to the compression algorithm selection request, a set of production host performance objectives of the production host, performing a compression algorithm selection analysis using the set of production host performance objectives and a compression selection model to obtain a compression algorithm selection for a compression algorithm, specifying the compression algorithm to the production host using a data agent, wherein the data agent is operatively connected to the production host, initiating a compression on the data object using the data agent by applying the compression algorithm to obtain a compressed data object, and initiating a storage of the compressed data object.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to a method and system for managing the storage of data produced by production hosts. Specifically, embodiments of the invention include a method for performing a machine learning algorithm on a large set of compression algorithms that may be performed on the data. The result of the machine learning algorithm is a compression selection model. The compression selection model may take as inputs: (i) any attributes associated with a data object to be compressed and (ii) a set of production host performance objectives that specify which performance metrics are more important to the production host environment when performing the compression. The compression selection model may be used, in conjunction with the aforementioned inputs, to select an optimal compression algorithm to be performed on the data object. Embodiments of the invention may further relate to initiating the compression and storage of the data object based on the selected compression algorithm.

Figure 1A:
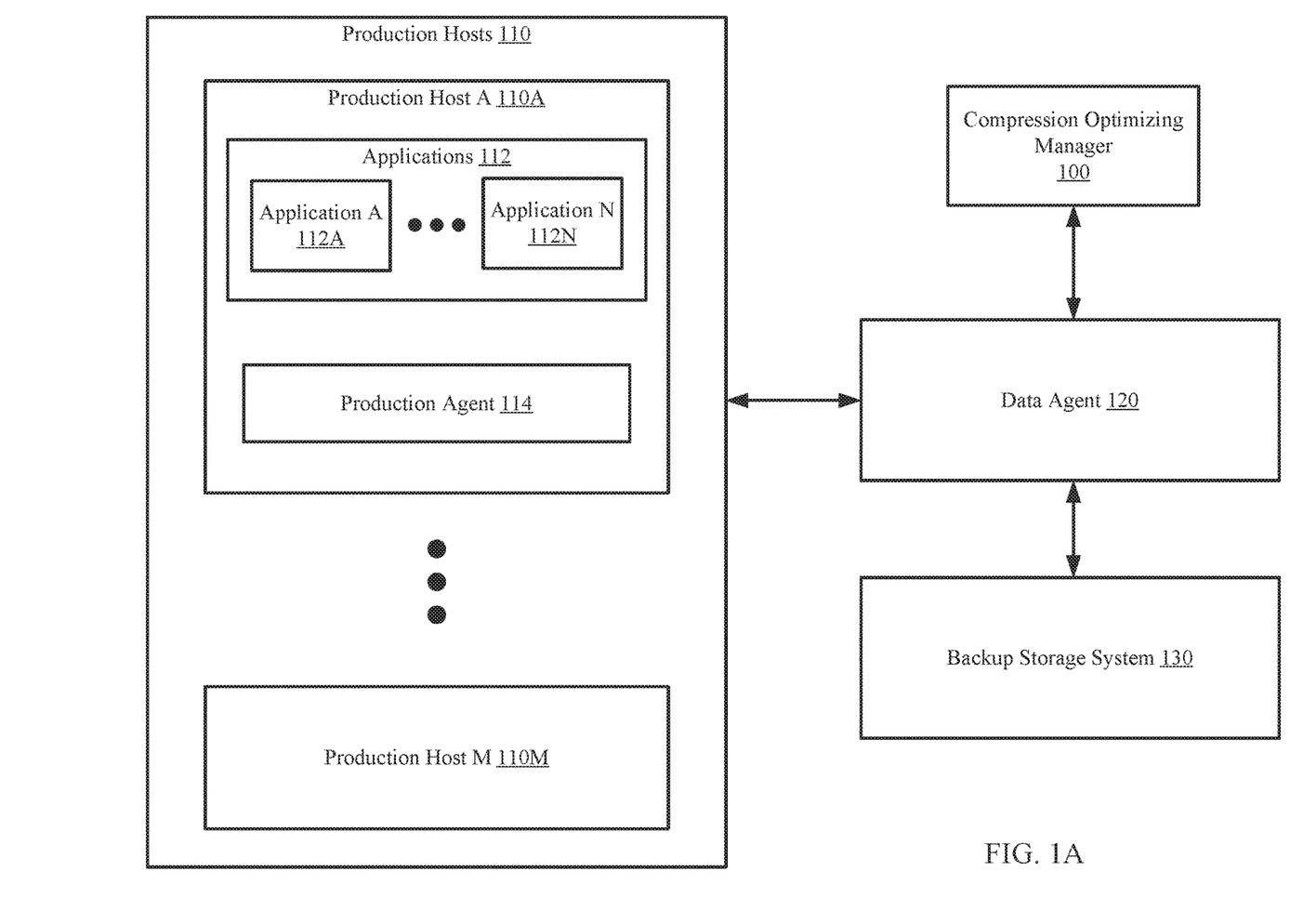
FIG. 1A shows a diagram of a system in accordance with one or more embodiments of the invention.

FIG. 1A shows an example system in accordance with one or more embodiments of the invention. The system includes a compression optimizing manager (100), a data agent (120), one or more production hosts (110) and a backup storage system (130). The system may include additional, fewer, and/or different components without departing from the invention. Each component may be operably connected to any of the other components via any combination of wired and/or wireless connections. Each component illustrated in FIG. 1A is discussed below.

In one or more embodiments of the invention, the data agent (120) manages the storage of data objects generated by the production hosts (110). The data agent (120) may include functionality for communicating with the production hosts (110) to determine whether data is to be compressed and stored in a backup storage system (130). Further, the data agent (120) includes functionality for communicating with a compression optimizing manager (100) to select a compression algorithm to be performed on a data object prior to storage.

As used herein, a lossless compression algorithm refers to an algorithm that encodes portions of data objects (e.g., a file) wherein the encoded portions take up less data than the original portions for the purpose of reducing the total amount of data used by the file. In contrast to a lossy compression algorithm, the data objects that have undergone lossless compression may be restored to the original data through decoding the encoded portions without any data loss. Examples of lossless compression algorithms include a Lempel-Ziv-Markov chain algorithm (LZMA), Lempel-Ziv Welch (LZW), free lossless audio codec (FLAC), run-length encoding (RLE), and/or other types of compression without departing from the invention.

In one or more embodiments of the invention, each compression algorithm may include variations based on parameters that impact the compression ratio. By impacting the compression ratio of the compression algorithm, one variation of a compression algorithm may be considered as a separate compression algorithm from a second variation of a first compression algorithm. For example, a LZMA compression algorithm of a first variation may be tuned to have a higher compression ratio than a LZMA compression algorithm of a second variation. Accordingly, the first variation may be considered one compression algorithm, and the second variation may be considered as a second, separate compression algorithm. As used herein, each variation of a compression algorithm may be referred to as a separate compression algorithm without departing from the invention.

Figure 4:
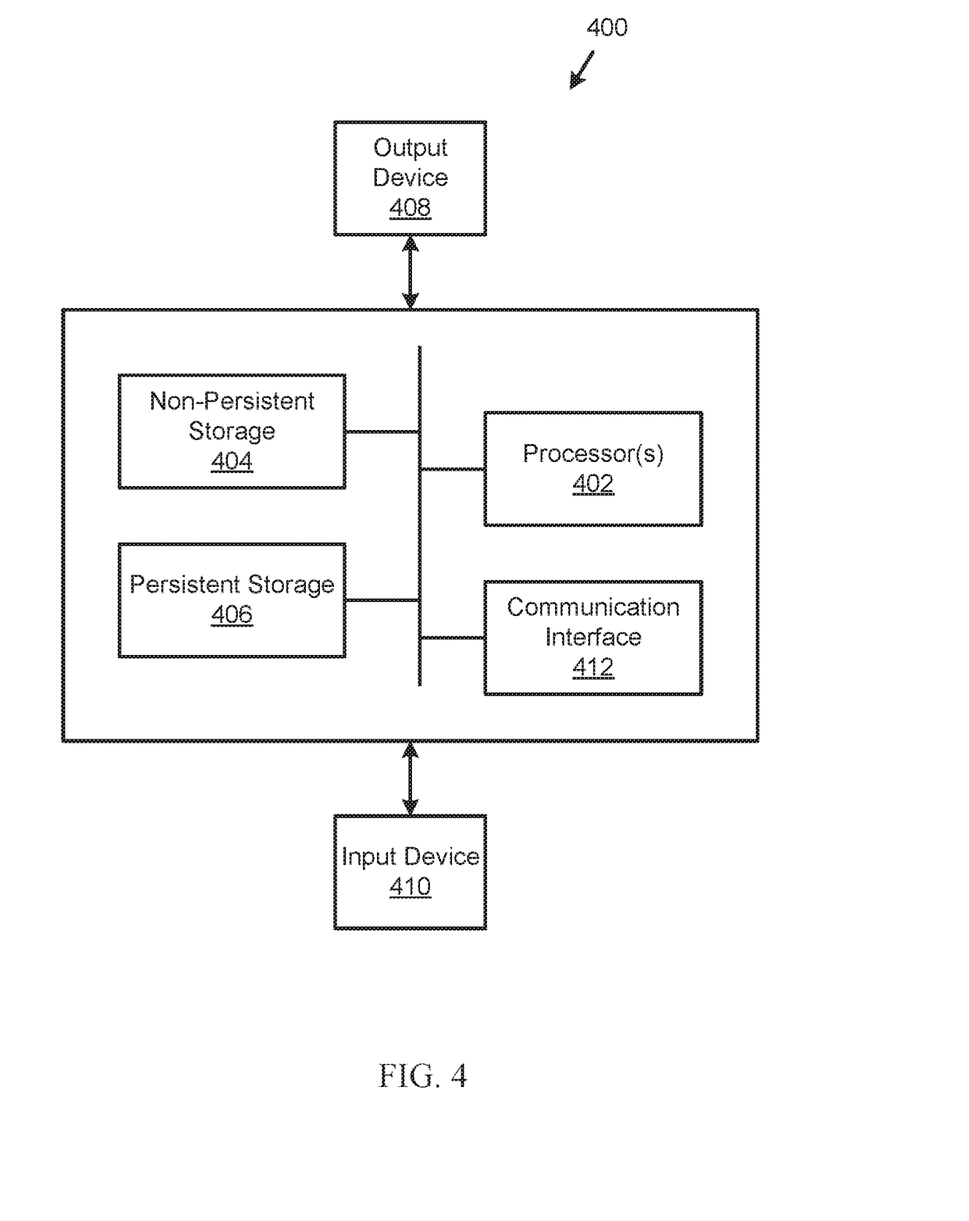
FIG. 4 shows a diagram of a computing device in accordance with one or more embodiments of the invention.

In one or more embodiments of the invention, the data agent (120) is implemented as a computing device (see e.g., FIG. 4). The computing device may be, for example, a mobile phone, a tablet computer, a laptop computer, a desktop computer, a server, a distributed computing system, or a cloud resource. The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the data agent (120) described throughout this application and/or all, or a portion thereof, of the methods illustrated in FIGS. 2A-2B.

In one or more embodiments of the invention, the data agent (120) is implemented as a logical device. The logical device may utilize the computing resources of any number of computing devices and thereby provide the functionality of the data agent (120) described throughout this application and/or all, or a portion thereof, of the methods illustrated in FIGS. 2A-2B. For additional details regarding the data agent (120), see, e.g., FIG. 1B.

In one or more embodiments of the invention, the compression optimizing manager (100) provides compression selection services to the data agent (120). Specifically, the compression optimizing manager (100) generates a compression selection model in accordance with FIG. 3A that may be used to select a compression algorithm. Further, the compression optimizing manager (100) includes functionality for inputting production host objectives (discussed in FIG. 1C) into the compression selection model to select a compression algorithm in accordance with FIG. 2B.

In one or more embodiments of the invention, a compression optimizing manager (100) is implemented as a computing device (see e.g., FIG. 4). The computing device may be, for example, a mobile phone, a tablet computer, a laptop computer, a desktop computer, a server, a distributed computing system, or a cloud resource. The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the compression optimizing manager (100) described throughout this application.

In one or more embodiments of the invention, the compression optimizing manager(s) (100) are implemented as a logical device. The logical device may utilize the computing resources of any number of computing devices and thereby provide the functionality of the compression optimizing manager (100) described throughout this application.

While illustrated as a separate component from the data agent (120) in FIG. 1A, the compression optimizing manager (100) may be a component of the data agent (120) without departing from the invention.

In one or more embodiments of the invention, the production hosts (110) host applications (112). The applications (112) may be logical entities executed using computing resources (not shown) of the production host (110A, 110M). Each of the applications (112A, 112N) may be performing similar or different processes. In one or more embodiments of the invention, the applications (112) provide services to users, e.g., clients (not shown). For example, the applications (112) may be categorized based on application types. Examples of application types include, but are not limited to, a database type that is associated with instances of databases, an email server type that is associated with email servers, an email module type that is associated with email modules, a virtual machine type that is associated with virtual machines, a hypervisor type that is associated with hypervisors, and a network management type that is associated with network management systems.

In one or more embodiments of the invention, each production host (110A, 110M) may be associated with an architecture. An architecture may be a structure in which production hosts operate and communicate with other production hosts of similar architectures. Each production host of a similar architecture may share, for example, a similar operating system, a similar network protocol, and/or include similar computing resources. Collectively, the production hosts (110) may be associated with one or more architectures. Examples of architectures of production hosts include, but are not limited to, cloud services, virtual machine hosts, storage systems, and database servers.

In one or more embodiments of the invention, a data object of an application type may have different data attributes to a data object of a second application type. For example, a data object of a virtual machine type may include data attributes such as a larger data size and a content type that is different from a data object that is an image file.

In one or more embodiments of the invention, each application may be identified using an application type identifier. The application type identifier may be a string of numbers, letters, symbols, or any combination thereof that uniquely identifies each application. The application type identifier may be generated by a compression optimizing manager (e.g., 150) operated by a user.

In one or more embodiments of the invention, the production host (110A, 110M) includes a production agent (114). The production agent may include functionality for generating backups of one or more applications (142A, 142N), storing the backups in the backup storage system (130), and/or obtaining the backups from the backup storage system (130) when restoring the applications (112A, 112N).

In one or more embodiments of the invention, the production agent(s) (114) may each perform backups of applications in backup sessions. In one or more embodiments of the invention, a backup session is an operation performed by a production agent that includes backing up a predetermined number of applications during the same period of time. The number of applications that may be backed up in a backup session may be determined by, for example, a hypervisor (not shown), a compression optimizing manager (e.g., 100), and/or any other entity without departing from the invention. The number of applications backed up in a backup session may be based on the computing resources available to the production agent performing the backup session.

In one or more embodiments of the invention, the production agent (114) is a physical device. The physical device may include circuitry. The physical device may be, for example, a field-programmable gate array, application specific integrated circuit, programmable processor, microcontroller, digital signal processor, or other hardware processor. The physical device may be adapted to provide the functionality of the production agent (114) described throughout this application.

In one or more of embodiments of the invention, the production agent (114) is implemented as computer instructions, e.g., computer code, stored on a persistent storage that when executed by a processor of the production host (110A, 110M) causes the production host (110A, 110M) to provide the functionality of the production agent (114) described throughout this application.

In one or more of embodiments of the invention, the applications (112) are implemented as computer instructions, e.g., computer code, stored on a persistent storage (e.g., on a production host (110A)) that when executed by a processor(s) of the production host (110A) cause the production host (110A) to provide the functionality of the applications (112) described throughout this application.

In one or more embodiments of the invention, each of the production hosts (110A, 110N) is implemented as a computing device (see e.g., FIG. 4). The computing device may be, for example, a mobile phone, a tablet computer, a laptop computer, a desktop computer, a server, a distributed computing system, or a cloud resource. The computing device may include one or more processors, memory (e.g., random access memory), and persistent storage (e.g., disk drives, solid state drives, etc.). The computing device may include instructions, stored on the persistent storage, that when executed by the processor(s) of the computing device cause the computing device to perform the functionality of the production host (110A, 110M) described throughout this application.

In one or more embodiments of the invention, each of the production hosts (110A, 110M) is implemented as a logical device. The logical device may utilize the computing resources of any number of computing devices and thereby provide the functionality of the production host (110A, 110M) described throughout this application.

In one or more embodiments of the invention, the backup storage system (130) store backups of the applications (112). The backup storage system (130) may communicate with the data agent (e.g., 120) when obtaining backups to be stored and/or when transferring backups to the production hosts (110) when restoring applications. In one or more embodiments of the invention, a backup is a copy of data associated with an application. A backup may further include additional data that enables a production agent to restore an application associated with the backup from any production host.

In one or more embodiments of the invention, the backup storage system (130) is implemented as a computing device (see e.g., FIG. 4). The computing device may be, for example, a mobile phone, a tablet computer, a laptop computer, a desktop computer, a server, a distributed computing system, or a cloud resource. The computing device may include one or more processors, memory (e.g., random access memory), and persistent storage (e.g., disk drives, solid state drives, etc.). The computing device may include instructions stored on the persistent storage, that when executed by the processor(s) of the computing device cause the computing device to perform the functionality of the backup storage system (130) described throughout this application.

In one or more embodiments of the invention, the backup storage system (130) is implemented as a logical device. The logical device may utilize the computing resources of any number of computing devices and thereby provide the functionality of the backup storage described throughout this application. For additional details regarding the backup storage system (130), see, e.g., FIG. 1B.

Figure 1B:
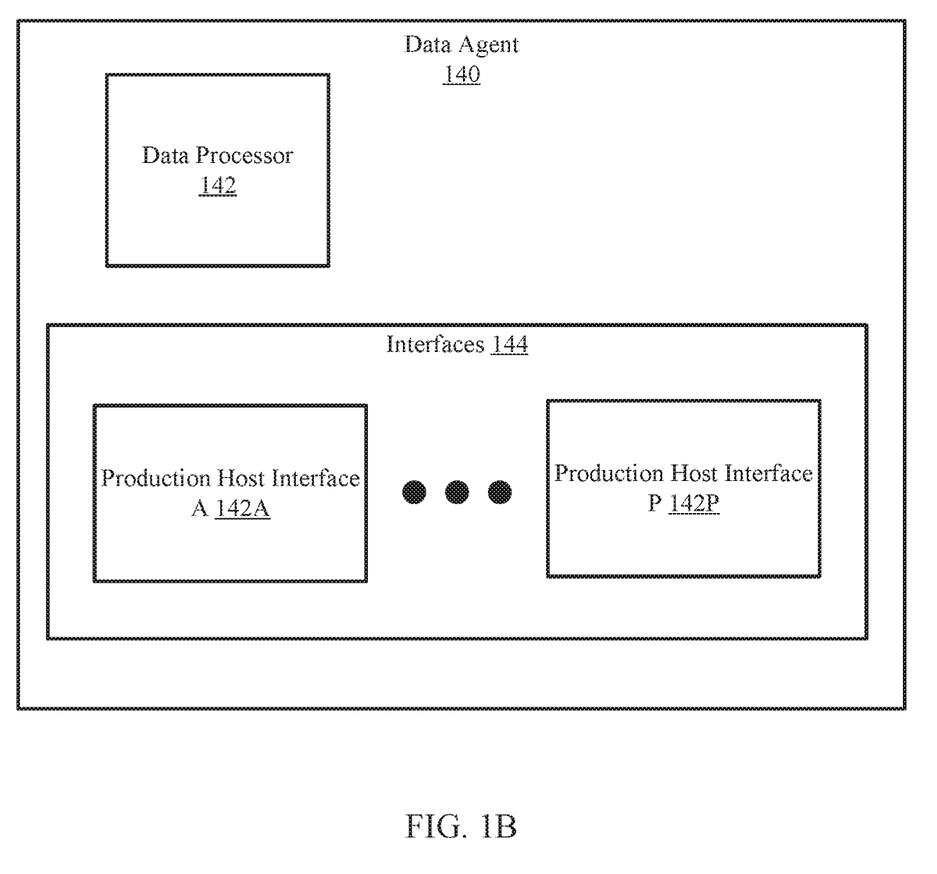
FIG. 1B shows a diagram of a data agent in accordance with one or more embodiments of the invention.

FIG. 1B shows a diagram of a data agent in accordance with one or more embodiments of the invention. The data agent (140) may be an embodiment of the data agent (120, FIG. 1A) discussed above. As discussed above, the data agent (140) manages data produced by production hosts. To perform the aforementioned functionality, the data agent (140) may include a data processor (142) and one or more interfaces (144). The data agent (140) may include additional, fewer, and/or different components without departing from the invention. Each of the aforementioned components of the data agent (140) illustrated in FIG. 1B is discussed below.

In one or more embodiments of the invention, the data processor (142) processes data objects obtained from the production hosts. The data processor (142) may process the data objects by, for example, compressing the data objects in accordance with one or more compression algorithms as determined (or otherwise selected) in accordance with FIGS. 2A-2B.

In one or more embodiments of the invention, the data processor (142) may further process the data objects by performing additional processing tasks on the data objects. Additional processing tasks may include, for example, deduplication, generating additional metadata for the data object, and data migration (e.g., from a production host to the backup storage system).

In one or more embodiments of the invention, each production host interface (142A, 142P) is an interface that enables the data agent (140) to communicate with a production host. Each production host interface (142A, 142P) may include functionality for communicating with a production host based on the architecture of the production host. For example, a production host of a first architecture utilizes a first protocol. A first production host interface (142A, 142P) may include functionality for communicating with the first production host via the first protocol. Further, a second production host interface (142A, 142P) may include functionality for communicating with a second production host of a second architecture.

Figure 1C:
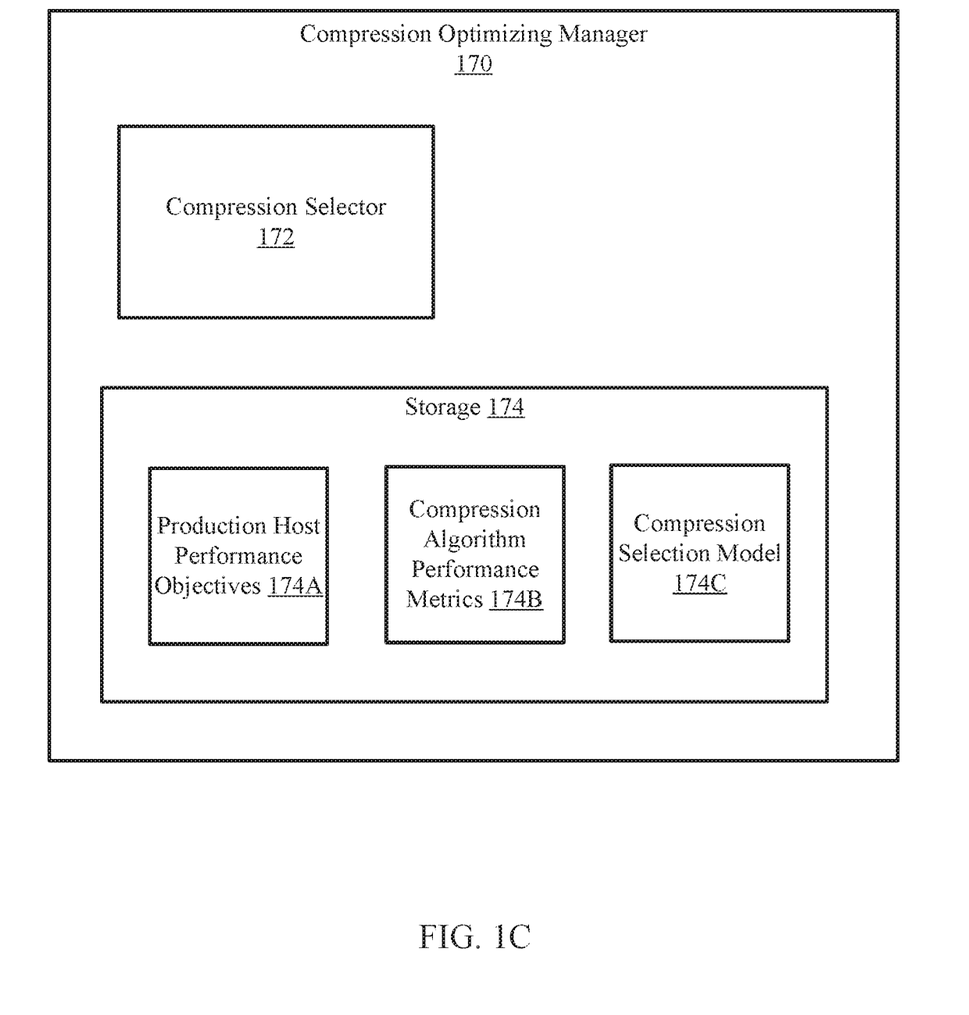
FIG. 1C shows a diagram of a compression optimizing manager in accordance with one or more embodiments of the invention.

FIG. 1C shows a diagram of a compression optimizing manager (170). The compression optimizing manager (170) may be an embodiment of the data agent (120) discussed above. As discussed above, the compression optimizing manager (170) may obtain backups of applications to be stored in a backup storage system. To perform the aforementioned functionality, the compression optimizing manager (170) may include a compression selector (172) and storage (174). The compression optimizing manager (170) may include additional, fewer, and/or different components without departing from the invention. Each of the aforementioned components of the compression optimizing manager (140) illustrated in FIG. 1C is discussed below.

In one or more embodiments of the invention, the compression selector (172) includes functionality for generating a compression selection model (174C) (discussed below) in accordance with FIG. 2A. Further, the compression selector (172) includes functionality for selecting a compression algorithm using the compression selection model (174C) in accordance with FIG. 2B. The compression selection may be performed using production host objectives (174A) (discussed below).

In one or more embodiments of the invention, the compression selector (172) is a physical device. The physical device may include circuitry. The physical device may be, for example, a field-programmable gate array, application specific integrated circuit, programmable processor, microcontroller, digital signal processor, or other hardware processor. The physical device may be adapted to provide the functionality of the compression optimizing manager (172) described throughout this application.

Figure 2A:
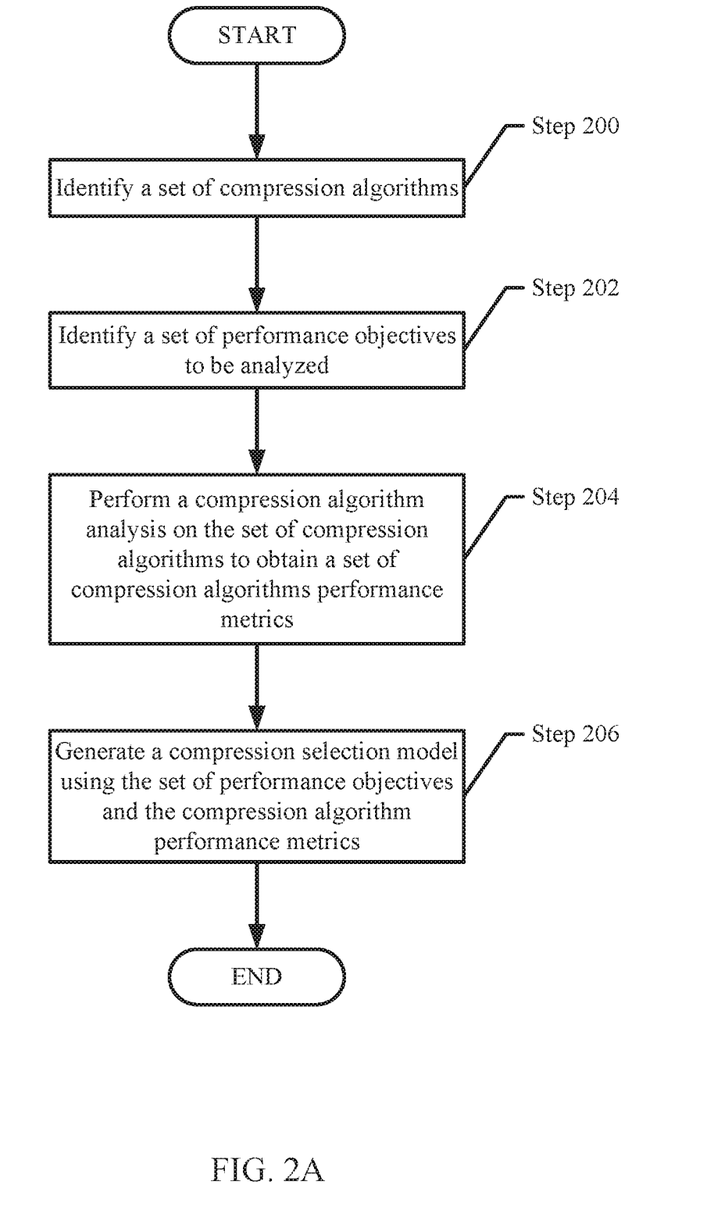
FIG. 2A shows a flowchart for a method for generating a compression selection model in accordance with one or more embodiments of the invention.
Figure 2B:
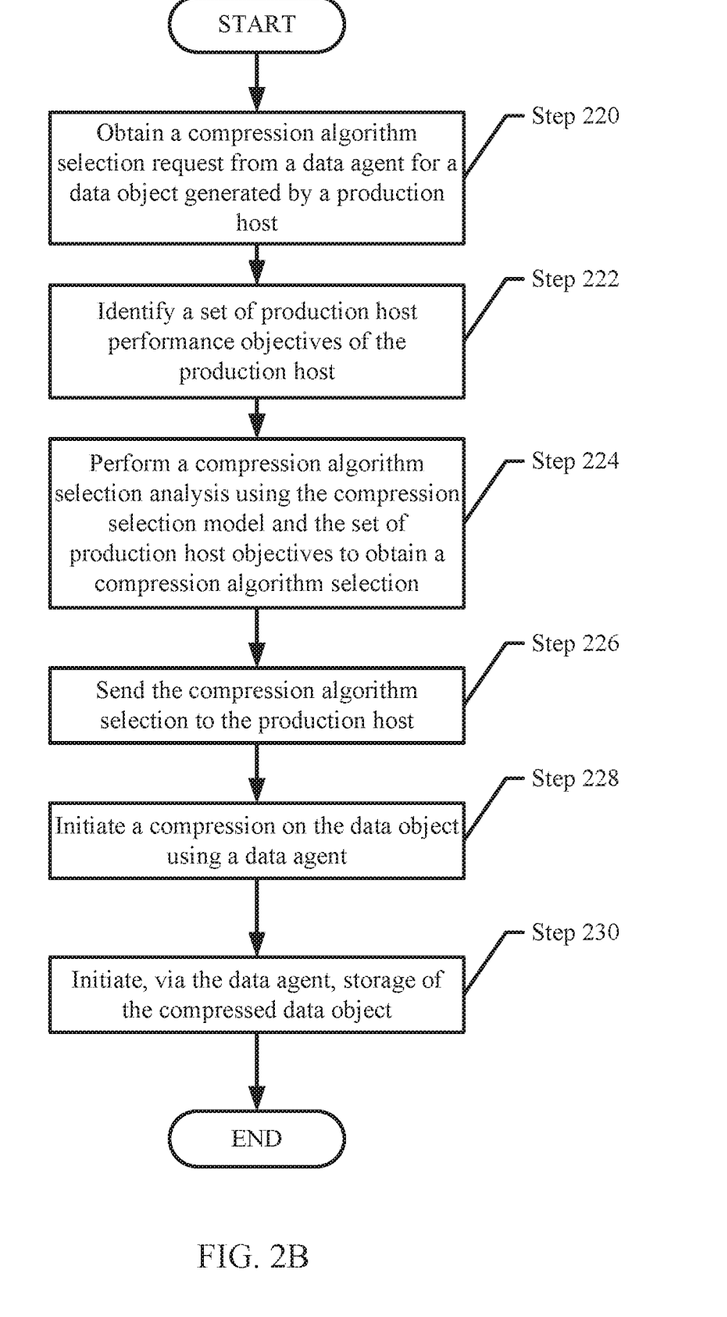
FIG. 2B shows a flowchart for selecting a compression algorithm in accordance with one or more embodiments of the invention.

In one or more of embodiments of the invention, the compression selector (172) is implemented as computer instructions, e.g., computer code, stored on a persistent storage that when executed by a processor of the compression optimizing manager (170) cause the compression optimizing manager (170) to provide the functionality of the compression selector (172) described throughout this application and/or all, or a portion thereof, of the method illustrated in FIGS. 2A-2B.

In one or more embodiments of the invention, the storage (174) stores at least one of: production host objectives (174A), compression algorithm performance metrics (174B), and a compression selection model (174C). The storage (174) may store additional, fewer, and/or different data structures without departing from the invention. Each of the data structures stored in the storage (174) and illustrated in FIG. 1C is discussed below.

In one or more embodiments of the invention, the production host objectives (174A) specify obtained preferences by each production hosts for performance metrics related to the performance of the compression algorithms. In one or more embodiments of the invention, the performance metrics of a compression algorithm relate to behavior of a compression as the compression algorithm is implemented. Examples of performance metrics include, but are not limited to, the compression ratio between pre-compression data and post-compression data, a compression time, and a decompression time. Other performance metrics may be utilized without departing from the invention.

The production host objectives (174A) may specify entries that each include, for example, a production host identifier and a weightage for each performance metric as preferred by the production host. For example, a first production host may prefer a compression rate over a compression time, so the production host objectives (174A) may specify an entry that specifies the first production host and a higher weightage of compression rate over compression time.

In one or more embodiments of the invention, the compression algorithm performance metrics (174B) (also referred to as "training compression algorithm performance metrics") are data structures that specify the performance metrics of one or more compression algorithms. Specifically, the compression algorithm performance metrics (174) may specify entries that each specify a compression algorithm (e.g., via a compression algorithm identifier) and the associated performance metrics of the corresponding compression algorithm. The compression algorithm performance metrics (174B) may be generated in accordance with FIG. 2A.

In one or more embodiments of the invention, the compression selection model (174C) is a data structure that associates the various weightages of one or more performance metrics to an optimal compression algorithm. For example, the compression selection model (174C) may be a function that takes as inputs preferences of performance metrics (e.g., performance objectives), and produces an output of a selected compression algorithm. The compression selection model (174C) may be generated in accordance with FIG. 2A.

FIGS. 2A-2B show flowcharts in accordance with one or more embodiments of the invention. While the various steps in the flowchart are presented and described sequentially, one of ordinary skill in the relevant art will appreciate that some or all of the steps may be executed in different orders, may be combined or omitted, and some or all steps may be executed in parallel. In one embodiment of the invention, the steps shown in FIGS. 2A-2B may be performed in parallel with any other steps shown in FIGS. 2A-2B without departing from the scope of the invention.

FIG. 2A shows a flowchart for a method for generating a compression selection model in accordance with one or more embodiments of the invention. The method shown in FIG. 2A may be performed by, for example, a compression optimizing manager (170, FIG. 1C). Other components of the system illustrated in FIG. 1A or FIG. 1C may perform the method of FIG. 2A without departing from the invention.

Turning to FIG. 2A, in step 200, a set of compression algorithms is identified. In one or more embodiments of the invention, the set of compression algorithms is identified based on a request obtained from an administrative system that provides the set of compression algorithms to be used to generate the compression selection model. Alternatively, the set of compression algorithms is identified by identifying an initial set of compression algorithms and identifying variations of each corresponding compression algorithms. The variations may be further included in the initial set to obtain the set of compression algorithms.

In step 202, a set of performance objectives is identified to be analyzed. In one or more embodiments of the invention, the performance objectives are specified by the administrative system managing the generation of the compression selection algorithm.

In step 204, a compression algorithm analysis is performed on the set of compression algorithms to obtain a set of training compression algorithm performance metrics associated with each performance objective. In one or more embodiments of the invention, the compression algorithm analysis includes performing each compression algorithm in the set of compression algorithms on a training set. The training set may include data objects of varying data characteristics. Examples of data characteristics include, but are not limited to: a data size, a file format (e.g., video file, audio file, image file, etc.), a metadata size, and a data object identifier (which may have a minimal effect on the training set). The compression algorithm analysis includes measuring the behavior of each compression applied to each data object when applying a compression algorithm. The measured behavior may be stored as training compression algorithm performance metrics.

In step 206, a compression selection model is generated using the set of performance objectives and the related training compression algorithm performance metrics. In one or more embodiments of the invention, the compression selection model may include a learning piece and an optimization piece.

In one or more embodiments of the invention, the learning piece is generated by applying a machine learning algorithm to the training compression algorithm performance metrics. In one or more embodiments of the invention, the compression selection model is obtained by providing the performance objectives, the compression algorithm performance metrics, and data characteristics as an input to the machine learning algorithm and producing weights associated with each parameter (i.e., the performance metrics).

In one or more embodiments of the invention, the learning piece includes learning patterns that are associated with values of the training compression algorithm performance metrics based on data object characteristics and the set of compression algorithms. The learning patterns may be, for example, average values of compression metrics obtained for each compression algorithm in the set and using different data object characteristics.

In one or more embodiments of the invention, the optimization piece of the model is a linear combination between weights given for each performance objective and estimates for the compression metrics obtained from the learning piece of the model (which are related to the input file type). The outcome of the learning piece is a model that can estimate compression metrics of different compression algorithms for different data object characteristics. The optimization piece is generated by combining compression estimates coming out of the learning piece with performance objectives. The outcome of the optimization piece is a selection of an optimal compression algorithm that satisfies performance objectives for a given data object having certain data characteristics. In one or more embodiments of the invention, the performance objectives may be represented as weights that are applied as inputs to the optimization piece to be used to make the selection.

FIG. 2B shows a flowchart for selecting a compression algorithm in accordance with one or more embodiments of the invention. The method shown in FIG. 2B may be performed by, for example, a compression optimizing manager (170, FIG. 1B). Other components of the system illustrated in FIG. 1A or FIG. 1B may perform the method of FIG. 2B without departing from the invention.

Turning to FIG. 2B, in step 220, a compression algorithm selection request is obtained from a data agent for a data object generated by a production host. The compression algorithm selection request may specify a set of production host performance objectives (e.g., the weights of each performance objectives as desired by the production host). Further, the compression algorithm selection request specifies data characteristics of the data object.

In step 222, a set of production host objectives of the production host is identified. In one or more embodiments of the invention, the set of production host performance objectives is specified in the compression algorithm selection request. In such embodiments in which the set of production host performance objective is not specified in the compression algorithm selection request, the set of production host performance objectives is identified by initiating a request, via a data agent, that specifies obtaining the set of production host performance objectives as desired by the production host.

In step 224, a compression algorithm selection analysis is performed using the compression selection model and the set of production host objectives to obtain a compression algorithm selection. In one or more embodiments of the invention, the compression algorithm selection analysis includes inputting the set of production host objectives and the data characteristics into the compression selection model (specifically, the optimization piece of the compression selection model). The output of the compression selection model is an optimal compression algorithm. The optimal compression algorithm is the compression algorithm selection.

In step 226, the compression algorithm selection is sent to the production host. In one or more embodiments of the invention, the compression algorithm selection is sent to the production host using the data agent. The data agent, via a production host interface, sends an identifier of the compression algorithm selection to the production host.

In step 228, a compression is initiated on the data object using the data agent. In one or more embodiments of the invention, the compression is performed by providing the data object to a data processor of the data agent. The data processor may implement the optimal compression algorithm selected in step 224. The result may be a compressed data object.

In step 230, storage of the compressed data object is initiated. In one or more embodiments of the invention, the storage includes sending the compressed data object to the production host via the production host interface.

In one or more embodiments of the invention, the storage includes storing the compressed data object in a backup storage system. The storage of the compressed data object may be specified by the production host (e.g., in the compression algorithm selection request).

Example

Figure 3A:
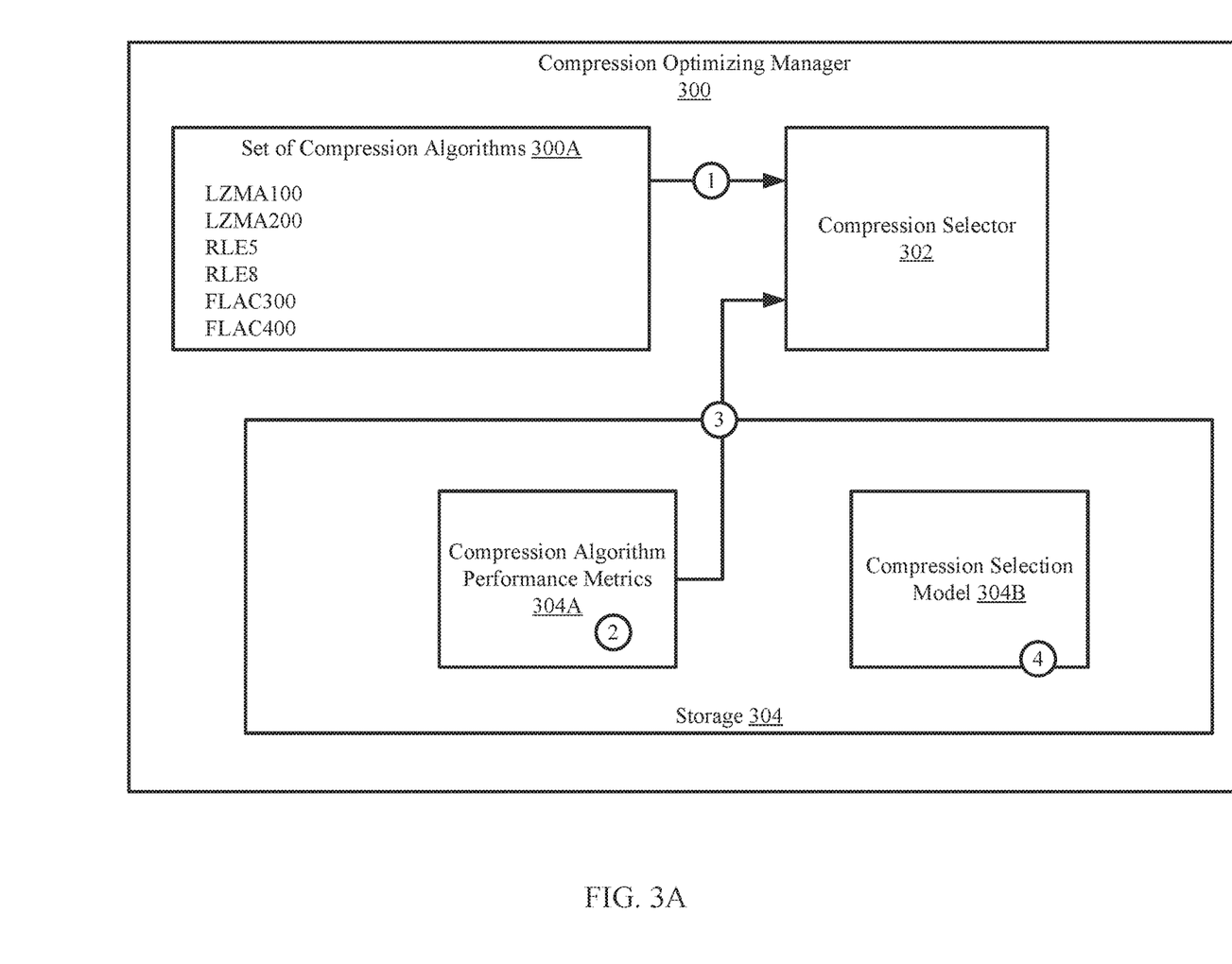
FIGS. 3A-3B show an example in accordance with one or more embodiments of the invention.
Figure 3B:
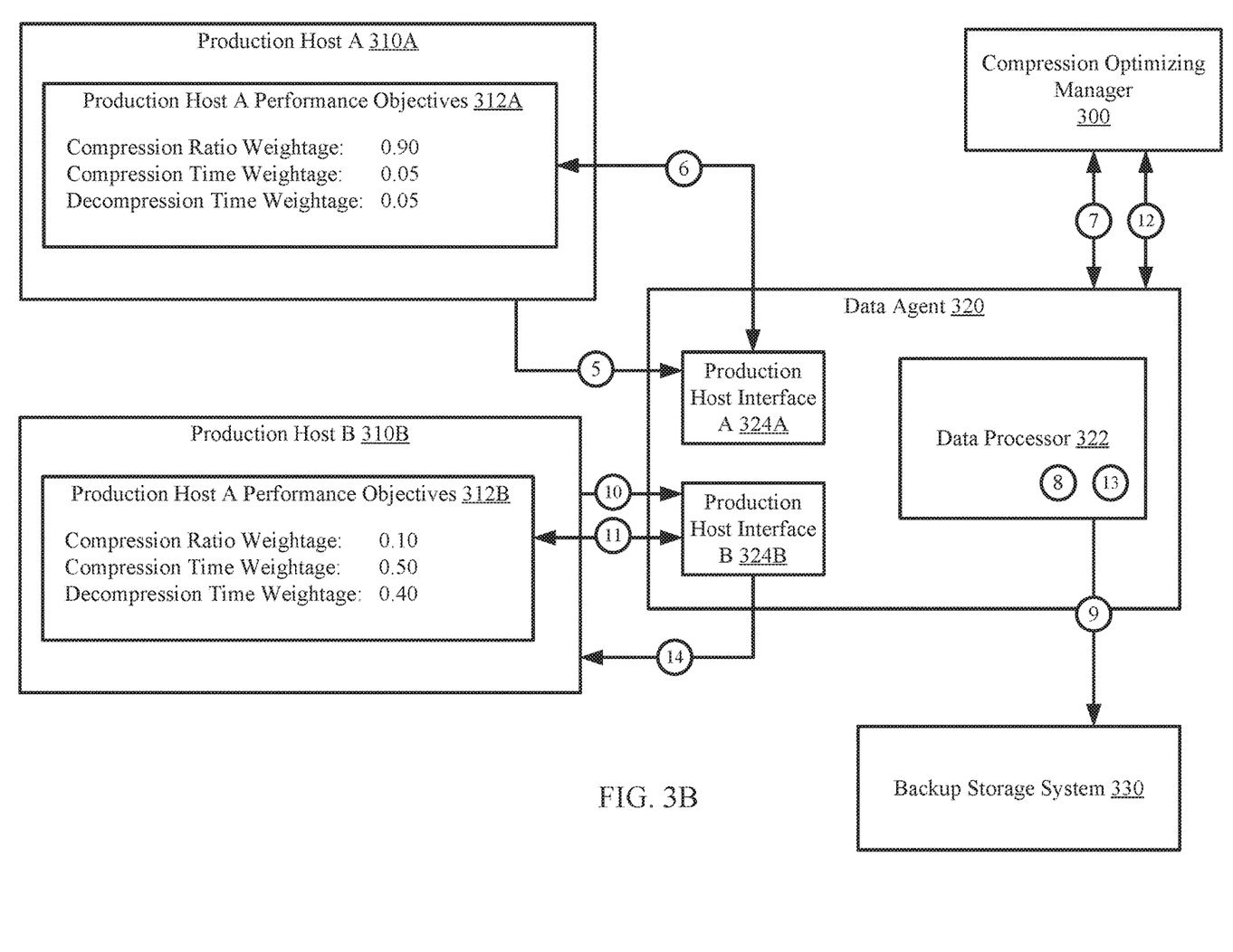

The following section describes an example. The example, illustrated in FIGS. 3A-3B, is not intended to limit the invention. Turning to the example, FIG. 3A shows a diagram of an example system. The example system includes a compression optimizing manager (300). For the sake of brevity, not all components of the example system are illustrated in FIG. 3A.

Turning to FIG. 3A, the compression optimizing manager (300) performs the method of FIG. 2A to generate a compression selection model (304B). Specifically, the compression selector (302) obtains a set of compression algorithms (300A) [1]. The set of compression algorithms (300A) includes variations of LZMA, RLE, and FLAC. Each compression algorithm, or variation thereof, performs the compression with varying performance metrics.

The compression selector (302) generates training compression algorithm performance metrics (304A) by executing each compression algorithm in the set of compression algorithms (300A) on a set of data objects (not shown) and measuring the compression ratios, the compression times, and decompression times for each compression algorithm implemented on each data object. The compression algorithm performance metrics (304A) specify: (i) the compression algorithms, (ii) the performance metrics of each compression algorithm associated with each data object, and (iii) data characteristics of the data objects. The compression algorithm performance metrics (304A) are stored in storage (304) of the compression optimizing manager (300) [2].

The compression selector (302) obtains the compression algorithm performance metrics (304A) and applies a machine learning algorithm on the compression algorithm performance metrics (304A) [3]. The result of applying the machine learning algorithm is the generation of the compression selection model (304B) [4]. The compression selection model (304B), in this example, obtains as inputs: (i) weights to each of the performance objectives (e.g., compression ratio, compression time, and decompression time) and (ii) a file type of a data object to be compressed (or, alternatively, a set of data characteristics for the data object). The output of the compression selection model (304B) is a selected compression algorithm that is best determined to meet the weights of each performance objective on a corresponding file type.

FIG. 3B shows a second diagram of the example system. For the sake of brevity, not all components of the example system are illustrated in FIG. 3B. As illustrated in FIG. 3B, the example system further includes two production hosts (310A, 310B), a data agent (320), and a backup storage system (330). At a later point in time, production host A (310A) sends a compression algorithm selection request to the data agent (320) [5]. The compression algorithm selection request specifies performing an optimal compression on an image file and storing the compressed image file in the backup storage system (330). The data agent (320), in response to the compression algorithm selection algorithm, utilizes a first production host interface (324A) to obtain production host A performance objectives (312A) [6]. As illustrated in FIG. 3B, the compression ratio weightage is of a higher value than the compression time and decompression time weightage values. This may correspond to a preference of production host A (310A) to compress the image file as much as possible without taking into account the times it would take to compress or decompress.

The data agent (320) provides the production host A performance objectives to the compression optimizing manager (300). The compression optimizing manager inputs the performance objectives to the compression selection model (not shown in FIG. 3B) to obtain a selected compression algorithm: LMZA200 [7]. The data processor (322) of the data agent (320) performs LZMA200 on the image file to obtain a compressed image file [8]. The data processor (322) further generates metadata associated with the compressed image file that specifies the compression algorithm applied to the compressed image file (e.g., LZMA200) and stores the compressed image file and the metadata in the backup storage system [9].

At a later point in time, production host B (310B) sends a second compression algorithm selection request to the data agent (320) [10]. The second compression algorithm selection request specifies performing an optimal compression on an audio file and returning the compressed audio file to production host B (310B). The data agent (320), in response to the second compression algorithm selection algorithm, utilizes a second production host interface (324B) to obtain production host B performance objectives (312B) [11]. As illustrated in FIG. 3B, production host B (310B) favors compression time and decompression time over compression ratio.

The data agent (320) provides the production host B performance objectives to the compression optimizing manager (300). The compression optimizing manager inputs the performance objectives to the compression selection model to obtain a selected compression algorithm: FLAC300 [12]. The data processor (322) of the data agent (320) performs FLAC300 on the audio file to obtain a compressed audio file [13]. The data processor (322) further generates metadata associated with the compressed audio file that specifies the compression algorithm applied to the compressed audio file (e.g., FLAC300) and sends the compressed image file and the associated metadata to production host B (310B) [14].

End of Example

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

One or more embodiments of the invention may be implemented using instructions executed by one or more processors of the data management device. Further, such instructions may correspond to computer readable instructions that are stored on one or more non-transitory computer readable mediums.

Embodiments of the invention may improve the efficiency of storing and processing data. Specifically, embodiments of the invention enable selection of an optimal compression algorithm that is tailored to the preferences of the corresponding production hosts. Embodiments of the invention reduce the cognitive burden applied to a user to determine the optimal compression algorithm. Further, by selecting the optimal compression algorithm, embodiments enable the production hosts to meet their respective performance objectives. Further, embodiments of the invention relate to reducing the storage usage of data objects generated by more than one production host. By performing the compression while meeting the performance objectives of the production host, embodiments of the invention improve the efficiency of the combination of: (i) the compression of the data, (ii) the minimizing of storage space use, and (iii) the efficiency of the operation of the production host.

Thus, embodiments of the invention may address the problem of inefficient use of computing resources. This problem arises due to the technological nature of the environment in which production hosts are utilized.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for managing data, the method comprising:
    obtaining a compression algorithm selection request for a data object, wherein the data object is generated by a production host;
    identifying, in response to the compression algorithm selection request, a set of production host performance objectives of the production host;
    performing a compression algorithm selection analysis using the set of production host performance objectives and a compression selection model to obtain a compression algorithm selection for a compression algorithm;
    specifying the compression algorithm to the production host using a data agent, wherein the data agent is operatively connected to the production host;
    initiating a compression on the data object using the data agent by applying the compression algorithm to obtain a compressed data object; and
    initiating a storage of the compressed data object.

2. The method of claim 1, further comprising:
    prior to obtaining the compression algorithm selection request:
        identifying a set of compression algorithms;
        identifying a set of performance objectives;
        obtaining a set of data objects;
        performing a compression algorithm analysis on each compression algorithm in the set of compression algorithms using the set of data objects to obtain a set of training compression algorithm performance metrics; and
        generating the compression selection model using the set of performance objectives and the set of training compression algorithm performance metrics.

3. The method of claim 2, wherein the compression selection model comprises a learning piece and an optimization piece.

4. The method of claim 3, wherein the learning piece comprises a plurality of learning patterns associated with values of the set of training compression algorithm performance metrics based on a plurality of data object characteristics and the set of compression algorithms.

5. The method of claim 4, wherein each learning pattern of the plurality of learning patterns comprises an average value of compression metrics obtained for a plurality of compression algorithms based on the plurality of data object characteristics.

6. The method of claim 3, wherein the optimization piece comprises determining the compression algorithm selection based on a function of the set of production host performance objectives and a set of performance metrics associated with data object characteristics.

7. The method of claim 6, wherein the set of performance metrics associated with data object characteristics specify estimates generated by the learning piece.

8. The method of claim 6, wherein the function comprises a linear combination between a set of weights associated with the set of production host performance objectives.

9. A non-transitory computer readable medium comprising computer readable program code, which when executed by a computer processor enables the computer processor to perform a method for managing data, the method comprising:
    obtaining a compression algorithm selection request for a data object, wherein the data object is generated by a production host;
    identifying, in response to the compression algorithm selection request, a set of production host performance objectives of the production host;
    performing a compression algorithm selection analysis using the set of production host performance objectives and a compression selection model to obtain a compression algorithm selection for a compression algorithm;
    specifying the compression algorithm to the production host using a data agent, wherein the data agent is operatively connected to the production host;

initiating a compression on the data object using the data agent by applying the compression algorithm to obtain a compressed data object; and initiating a storage of the compressed data object.

10. The non-transitory computer readable medium of claim 9, the method further comprising:

prior to obtaining the compression algorithm selection request:
identifying a set of compression algorithms
identifying a set of performance objectives;
obtaining a set of data objects;
performing a compression algorithm analysis on each compression algorithm in the set of compression algorithms using the set of data objects to obtain a set of training compression algorithm performance metrics; and
generating the compression selection model using the set of performance objectives and the set of training compression algorithm performance metrics.

11. The non-transitory computer readable medium of claim 10,
wherein the compression selection model comprises a learning piece and an optimization piece, and
wherein performing the compression algorithm selection analysis using the set of production host performance objectives and the compression selection model comprises inputting the set of performance objectives into the optimization piece to generate the compression algorithm selection as an output.

12. The non-transitory computer readable medium of claim 10, wherein the set of performance objectives comprises at least one of: a compression ratio, a compression time, and a decompression time.

13. The non-transitory computer readable medium of claim 10, wherein each of the set of production host performance objectives comprises a set of weights each associated with a performance objective of the set of performance objectives.

14. The non-transitory computer readable medium of claim 9, the method further comprising:
obtaining a second compression algorithm selection request for a second data object, wherein the second data object is generated by a second production host, wherein the second production host is of a second architecture;
identifying, in response to the second compression algorithm selection request, a second set of production host performance objectives of the second production host;
performing a second compression algorithm selection analysis using the second set of production host performance objectives and the compression selection model to obtain a second compression algorithm selection for a second compression algorithm;
specifying the second compression algorithm to the second production host using the data agent;
initiating a second compression on the second data object using the data agent by applying the second compression algorithm to obtain a second compressed data object; and
initiating storage of the second compressed data object, wherein the production host is of a first architecture.

15. A system, comprising:
a processor; and
memory comprising instructions which, when executed by the processor, perform a method, the method comprising:

obtaining a compression algorithm selection request for a data object, wherein the data object is generated by a production host;
identifying, in response to the compression algorithm selection request, a set of production host performance objectives of the production host;
performing a compression algorithm selection analysis using the set of production host performance objectives and a compression selection model to obtain a compression algorithm selection for a compression algorithm;
specifying the compression algorithm to the production host using a data agent, wherein the data agent is operatively connected to the production host;
initiating a compression on the data object using the data agent by applying the compression algorithm to obtain a compressed data object; and initiating a storage of the compressed data object.

16. The system of claim 15, the method further comprising:

prior to obtaining the compression algorithm selection request:
identifying a set of compression algorithms
identifying a set of performance objectives;
obtaining a set of data objects;
performing a compression algorithm analysis on each compression algorithm in the set of compression algorithms using the set of data objects to obtain a set of training compression algorithm performance metrics; and
generating the compression selection model using the set of performance objectives and the set of training compression algorithm performance metrics.

17. The system of claim 16,
wherein the compression selection model comprises a learning piece and an optimization piece, and
wherein performing the compression algorithm selection analysis using the set of production host performance objectives and the compression selection model comprises inputting the set of performance objectives into the optimization piece to generate the compression algorithm selection as an output.

18. The system of claim 16, wherein the set of performance objectives comprises at least one of: a compression ratio, a compression time, and a decompression time.

19. The system of claim 16, wherein each of the set of production host performance objectives comprises a set of weights each associated with a performance objective of the set of performance objectives.

20. The system of claim 15, the method further comprising:
obtaining a second compression algorithm selection request for a second data object, wherein the second data object is generated by a second production host;
identifying, in response to the second compression algorithm selection request, a second set of production host performance objectives of the second production host;
performing a second compression algorithm selection analysis using the second set of production host performance objectives and the compression selection model to obtain a second compression algorithm selection for a second compression algorithm;
specifying the second compression algorithm to the second production host using the data agent;

initiating a second compression on the second data object using the data agent by applying the second compression algorithm to obtain a second compressed data object; and initiating storage of the second compressed data object, wherein the production host is of a first architecture, and wherein the second production host is of a second architecture.

* * * * *

UNITED STATES PATENT AND TRADEMARK OFFICE
CERTIFICATE OF CORRECTION

| | |
|---|---|
| PATENT NO. | : 11,394,397 B2 |
| APPLICATION NO. | : 17/081614 |
| DATED | : July 19, 2022 |
| INVENTOR(S) | : Rômulo Teixeira De Abreu Pinho, Vinicius Michel Gottin and Joel Evans Christner |

It is certified that error appears in the above-identified patent and that said Letters Patent is hereby corrected as shown below:

On the Title Page

Item (72) Inventors: Joel Evans Christner, city of residence, "San Jose, TX ( US )" should read -- San Jose, CA (US) --.

Signed and Sealed this
Twenty-ninth Day of November, 2022

Katherine Kelly Vidal
*Director of the United States Patent and Trademark Office*